(12) United States Patent
Goh et al.

(10) Patent No.: US 12,341,121 B2
(45) Date of Patent: Jun. 24, 2025

(54) THROUGH-SUBSTRATE UNDERFILL FORMATION FOR AN INTEGRATED CIRCUIT ASSEMBLY

(71) Applicant: Intel Corporation, Santa Clara, CA (US)

(72) Inventors: Eng Huat Goh, Ayer Itam (MY); Kyle Davidson, Hillsboro, OR (US); Min Suet Lim, Penang (MY); Kevin Byrd, Portland, OR (US); James Wade, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 1045 days.

(21) Appl. No.: 17/113,410

(22) Filed: Dec. 7, 2020

(65) Prior Publication Data
US 2022/0181289 A1 Jun. 9, 2022

(51) Int. Cl.
*H01L 23/48* (2006.01)
*H01L 21/56* (2006.01)
(Continued)

(52) U.S. Cl.
CPC ............ *H01L 24/32* (2013.01); *H01L 21/563* (2013.01); *H01L 23/13* (2013.01);
(Continued)

(58) Field of Classification Search
CPC ....... H01L 24/32; H01L 21/563; H01L 23/13; H01L 23/49833; H01L 23/642;
(Continued)

(56) References Cited

U.S. PATENT DOCUMENTS 6,404,062 B1 * 6/2002 Taniguchi ........... H01L 25/0655
438/109
9,252,095 B2 * 2/2016 Kim ........................ H01L 24/97
(Continued)

FOREIGN PATENT DOCUMENTS

| JP | 2009290011 | 2/2014 |
| JP | 2014222703 | 11/2014 |

OTHER PUBLICATIONS

Extended European Search Report for European Patent Application No. 21197919.0, dated Mar. 25, 2022.

*Primary Examiner* — Caleb E Henry
*Assistant Examiner* — Dilinh P Nguyen
(74) *Attorney, Agent, or Firm* — Essential Patents Group, LLP

(57) ABSTRACT

An integrated circuit package may be fabricated by disposing an underfill material between an electronic substrate and an integrated circuit device through an opening in the electronic substrate. In one embodiment, an integrated circuit assembly may include an electronic substrate having a first surface and an opposing second surface, wherein the electronic substrate includes at least one opening extending from the first surface to the second surface. The integrated circuit assembly may further include an integrated circuit device, wherein the integrated circuit device is electrically attached to the electronic substrate with at least one interconnect, and an underfill material may be disposed between the first surface of the electronic substrate and the integrated circuit device, wherein a portion of the underfill material extends into the opening in the electronic substrate.

10 Claims, 6 Drawing Sheets

(51) Int. Cl.
*H01L 23/00* (2006.01)
*H01L 23/13* (2006.01)
*H01L 23/498* (2006.01)
*H01L 23/52* (2006.01)
*H01L 23/64* (2006.01)

(52) U.S. Cl.
CPC ...... *H01L 23/49833* (2013.01); *H01L 23/642* (2013.01); *H01L 24/16* (2013.01); *H01L 24/17* (2013.01); *H01L 24/73* (2013.01); *H01L 2224/16227* (2013.01); *H01L 2224/17135* (2013.01); *H01L 2224/32237* (2013.01); *H01L 2224/73204* (2013.01); *H01L 2224/9202* (2013.01); *H01L 2224/92125* (2013.01); *H01L 2924/19106* (2013.01)

(58) Field of Classification Search
CPC ......... H01L 24/16; H01L 24/17; H01L 24/73; H01L 2224/16227; H01L 2224/17135; H01L 2224/32237; H01L 2224/73204; H01L 2224/9202; H01L 2224/92125; H01L 2924/19106
USPC .......................................................... 257/737
See application file for complete search history.

(56) References Cited

U.S. PATENT DOCUMENTS

| | | |
|---|---|---|
| 2003/0113952 A1 | 6/2003 | Sambasivam et al. |
| 2004/0183193 A1* | 9/2004 | Koide ..................... H01L 23/50 |
| | | 257/E23.079 |
| 2006/0063303 A1* | 3/2006 | Koide ..................... H05K 1/141 |
| | | 257/E23.079 |
| 2007/0045867 A1 | 3/2007 | Machida |
| 2014/0038354 A1 | 2/2014 | Hong |
| 2020/0212005 A1 | 7/2020 | Fang et al. |

* cited by examiner

THROUGH-SUBSTRATE UNDERFILL FORMATION FOR AN INTEGRATED CIRCUIT ASSEMBLY

TECHNICAL FIELD

Embodiments of the present description generally relate to the field of integrated circuit package or assembly fabrication, and, more specifically, to forming an underfill structure in an integrated circuit assembly by injecting a underfill material through an electronic substrate.

BACKGROUND

The integrated circuit industry is continually striving to produce ever faster, smaller, and thinner electronic devices and packages for use in various electronic products, including, but not limited to, computer servers and portable products, such as portable computers, electronic tablets, cellular phones, digital cameras, and the like.

As these goals are achieved, packaging of the electronic devices becomes more challenging. A typical electronic package includes at least one integrated circuit device that is mounted on an electronic substrate, such that bond pads, or other such electrical attachment structure, on the integrated circuit device are attached directly to corresponding bond lands, or other such electrical attachment structure, on the electronic substrate with interconnection structures. To enhance the reliability of the connection between the integrated circuit device bond pads and the electronic substrate bond lands, an underfill material may be disposed between the integrated circuit device and the electronic substrate for mechanical reinforcement.

Underfill materials are generally low viscosity materials, such as low viscosity epoxy materials, which may be dispensed from a dispensing needle along at least one edge of the integrated circuit device. The underfill material is drawn between the integrated circuit device and the electronic substrate by capillary action, and the underfill material is subsequently cured (hardened). However, as integrated circuit devices become smaller, there is a reduction in the size of the gap between the integrated circuit device and the electronic substrate, and the reduction of the interconnection structure pitch (spacing). This requires decreasing the viscosity and/or improving the wettability of the underfill material in order to wick between the integrated circuit device and the electronic substrate. The decreased viscosity and/or improved wettability can result in the underfill material "bleeding out" beyond the gap between the integrated circuit device and the electronic substrate and covering valuable surface area on the electronic substrate and/or interfering with other components in the integrated circuit assembly. One way to prevent such underfill bleed out is through the fabrication of containment structures, such as dams, trenches, and the like. However, these containment structures add cost to the integrated circuit assembly and still require a portion of the valuable surface area on the electronic substrate.

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following detailed description and appended claims, taken in conjunction with the accompanying drawings. It is understood that the accompanying drawings depict only several embodiments in accordance with the present disclosure and are, therefore, not to be considered limiting of its scope. The disclosure will be described with additional specificity and detail through use of the accompanying drawings and/or schematics, such that the advantages of the present disclosure can be more readily ascertained, in which:

DETAILED DESCRIPTION

Figure 1:
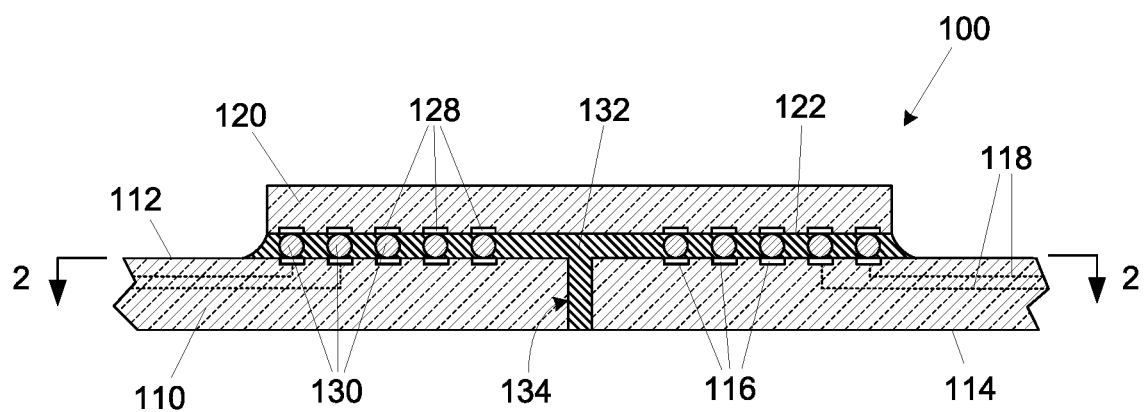
FIG. 1 is a side cross-sectional view of an integrated circuit assembly, according to an embodiment of the present description.

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. References within this specification to "one embodiment" or "an embodiment" mean that a particular feature, structure, or characteristic described in connection with the embodiment is included in at least one implementation encompassed within the present description. Therefore, the use of the phrase "one embodiment" or "in an embodiment" does not necessarily refer to the same embodiment. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

The terms "over", "to", "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

The term "package" generally refers to a self-contained carrier of one or more dice, where the dice are attached to the package substrate, and may be encapsulated for protection, with integrated or wire-bonded interconnects between the dice and leads, pins or bumps located on the external portions of the package substrate. The package may contain a single die, or multiple dice, providing a specific function. The package is usually mounted on a printed circuit board for interconnection with other packaged integrated circuits and discrete components, forming a larger circuit.

Here, the term "cored" generally refers to a substrate of an integrated circuit package built upon a board, card or wafer comprising a non-flexible stiff material. Typically, a small printed circuit board is used as a core, upon which integrated circuit device and discrete passive components may be soldered. Typically, the core has vias extending from one side to the other, allowing circuitry on one side of the core to be coupled directly to circuitry on the opposite side of the core. The core may also serve as a platform for building up layers of conductors and dielectric materials.

Here, the term "coreless" generally refers to a substrate of an integrated circuit package having no core. The lack of a core allows for higher-density package architectures, as the through-vias have relatively large dimensions and pitch compared to high-density interconnects.

Here, the term "land side", if used herein, generally refers to the side of the substrate of the integrated circuit package closest to the plane of attachment to a printed circuit board, motherboard, or other package. This is in contrast to the term "die side", which is the side of the substrate of the integrated circuit package to which the die or dice are attached.

Here, the term "dielectric" generally refers to any number of non-electrically conductive materials that make up the structure of a package substrate. For purposes of this disclosure, dielectric material may be incorporated into an integrated circuit package as layers of laminate film or as a resin molded over integrated circuit dice mounted on the substrate.

Here, the term "metallization" generally refers to metal layers formed over and through the dielectric material of the package substrate. The metal layers are generally patterned to form metal structures such as traces and bond pads. The metallization of a package substrate may be confined to a single layer or in multiple layers separated by layers of dielectric.

Here, the term "bond pad" generally refers to metallization structures that terminate integrated traces and vias in integrated circuit packages and dies. The term "solder pad" may be occasionally substituted for "bond pad" and carries the same meaning.

Here, the term "solder bump" generally refers to a solder layer formed on a bond pad. The solder layer typically has a round shape, hence the term "solder bump".

Here, the term "substrate" generally refers to a planar platform comprising dielectric and metallization structures. The substrate mechanically supports and electrically couples one or more IC dies on a single platform, with encapsulation of the one or more IC dies by a moldable dielectric material. The substrate generally comprises solder bumps as bonding interconnects on both sides. One side of the substrate, generally referred to as the "die side", comprises solder bumps for chip or die bonding. The opposite side of the substrate, generally referred to as the "land side", comprises solder bumps for bonding the package to a printed circuit board.

Here, the term "assembly" generally refers to a grouping of parts into a single functional unit. The parts may be separate and are mechanically assembled into a functional unit, where the parts may be removable. In another instance, the parts may be permanently bonded together. In some instances, the parts are integrated together.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, magnetic or fluidic connection between the things that are connected or an indirect connection, through one or more passive or active intermediary devices.

The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The vertical orientation is in the z-direction and it is understood that recitations of "top", "bottom", "above" and "below" refer to relative positions in the z-dimension with the usual meaning. However, it is understood that embodiments are not necessarily limited to the orientations or configurations illustrated in the figure.

The terms "substantially," "close," "approximately," "near," and "about," generally refer to being within +/−10% of a target value (unless specifically specified). Unless otherwise specified the use of the ordinal adjectives "first," "second," and "third," etc., to describe a common object, merely indicate that different instances of like objects to which are being referred and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

Views labeled "cross-sectional", "profile" and "plan" correspond to orthogonal planes within a cartesian coordinate system. Thus, cross-sectional and profile views are taken in the x-z plane, and plan views are taken in the x-y plane. Typically, profile views in the x-z plane are cross-sectional views. Where appropriate, drawings are labeled with axes to indicate the orientation of the figure.

Embodiments of the present description relate to disposing an underfill material between an electronic substrate and an integrated circuit device through an opening in the electronic substrate. In one embodiment, an integrated circuit assembly may include an electronic substrate having a first surface and an opposing second surface, wherein the electronic substrate includes at least one opening extending from the first surface to the second surface. The integrated circuit assembly may further include an integrated circuit device, wherein the integrated circuit device is electrically attached to the electronic substrate with at least one interconnect, and an underfill material may be disposed between the first surface of the electronic substrate and the integrated circuit device, wherein a portion of the underfill material extends into the opening in the electronic substrate.

FIG. 1 illustrates an integrated circuit assembly 100 having at least one integrated circuit device 120 attached to an electronic substrate 110 in a configuration generally known as a flip-chip or controlled collapse chip connection ("C4") configuration, according to an embodiment of the present description. The integrated circuit device 120 may be any appropriate active device, including, but not limited to, an integrated circuit die, an integrated circuit package, and the like, The integrated circuit die may include, but is not limited to, a microprocessor, a chipset, a graphics device, a wireless device, a memory device, an application specific integrated circuit, or the like. The integrated circuit package may include, but is not limited to, combinations and/or stacks of integrated circuit dice, which may be mounted on a package substrate, or the like.

In an embodiment of the present description shown in FIG. 1, the integrated circuit device 120 may be attached to the electronic substrate 110 with a plurality of device-to-substrate interconnects 130. In one embodiment of the present description, the device-to-substrate interconnects 130 may extend between bond pads 116 on a first surface 112 of the electronic substrate 110 and bond pads 128 on a first surface 122 of the integrated circuit device 120.

In one embodiment, the device-to-substrate interconnects 130 may be solder balls formed from tin, lead/tin alloys (for example, 63% tin/37% lead solder), and high tin content alloys (e.g. 90% or more tin—such as tin/bismuth, eutectic tin/silver, ternary tin/silver/copper, eutectic tin/copper, and similar alloys). The device-to-substrate interconnects 130 may be in electrical communication with integrated circuitry (not shown) within the integrated circuit device 120.

The electronic substrate 110 may be any appropriate device, including, but not limited to, a passive substrate (such as an interposer, a circuit board, and the like) or a combination of an active device (not shown), such as, a microprocessor, a chipset, a graphics device, a wireless device, a memory device, an application specific integrated circuit, combinations thereof, stacks thereof, or the like, embedded in the passive electronic substrate 110.

The electronic substrate 110 may comprise a plurality of dielectric material layers (not shown), which may include build-up films and/or solder resist layers, and may be composed of an appropriate dielectric material, including, but not limited to, bismaleimide triazine resin, fire retardant grade 4 material, polyimide material, silica filled epoxy material, glass reinforced epoxy material, and the like, as well as low-k and ultra low-k dielectrics (dielectric constants less than about 3.6), including, but not limited to, carbon doped dielectrics, fluorine doped dielectrics, porous dielectrics, organic polymeric dielectrics, and the like. The electronic substrate 110 may further include conductive routes 118 or "metallization" (shown in dashed lines) extending through the electronic substrate 110. The bond pads 116 on the first surface 112 of the electronic substrate 110 may be in electrical contact with the conductive routes 118, and the conductive routes 118 may extend through the electronic substrate 110 and be electrically connected to external components (not shown).

As will be understood to those skilled in the art, the conductive routes 118 may be a combination of conductive traces (not shown) and conductive vias (not shown) extending through the plurality of dielectric material layers (not shown). These conductive traces and conductive vias are well known in the art and are not shown in FIG. 1 for purposes of clarity. The conductive traces and the conductive vias may be made of any appropriate conductive material, including but not limited to, metals, such as copper, silver, nickel, gold, aluminum, alloys thereof, and the like. As will be understood to those skilled in the art, the electronic substrate 110 may be a cored substrate or a coreless substrate.

An electrically-insulating underfill material 132, such as an epoxy material, may be disposed between the integrated circuit device 120 and the electronic substrate 110 to substantially surround each device-to-substrate interconnect of the plurality of device-to-substrate interconnects 130. The underfill material 132 may provide structural integrity and may prevent contamination, as will be understood to those skilled in the art. As shown in FIG. 1, the electronic substrate 110 may include at least one opening 134 extending from the first surface 112 to a second surface 114 (opposing the first surface 112) of the electronic substrate 110. The opening 134 is used to introduce the underfill material 132 between the integrated circuit device 120 and the electronic substrate 110, and, thus, at least a portion of the underfill material 132 will extend into the opening 134. In an embodiment of the present description, the opening 134 may be made by any known process, including, but not limited to, laser drilling, ion ablation, etching, and the like. In a specific embodiment, the opening 134 may be formed as a plated through hole, as known in the art. In one embodiment, the underfill material 132 may be dispensed between the first surface 122 of the integrated circuit device 120 and the first surface of the first surface 112 of the electronic substrate 110 as a viscous liquid and then hardened with a curing process. In an embodiment of the present description, the underfill material 132 may be injected under positive pressure into the opening 134 from the second surface 114 of the electronic substrate 110, which reduces or eliminates capillary action as the driving force for the distribution of the underfill material 132.

Figure 2:
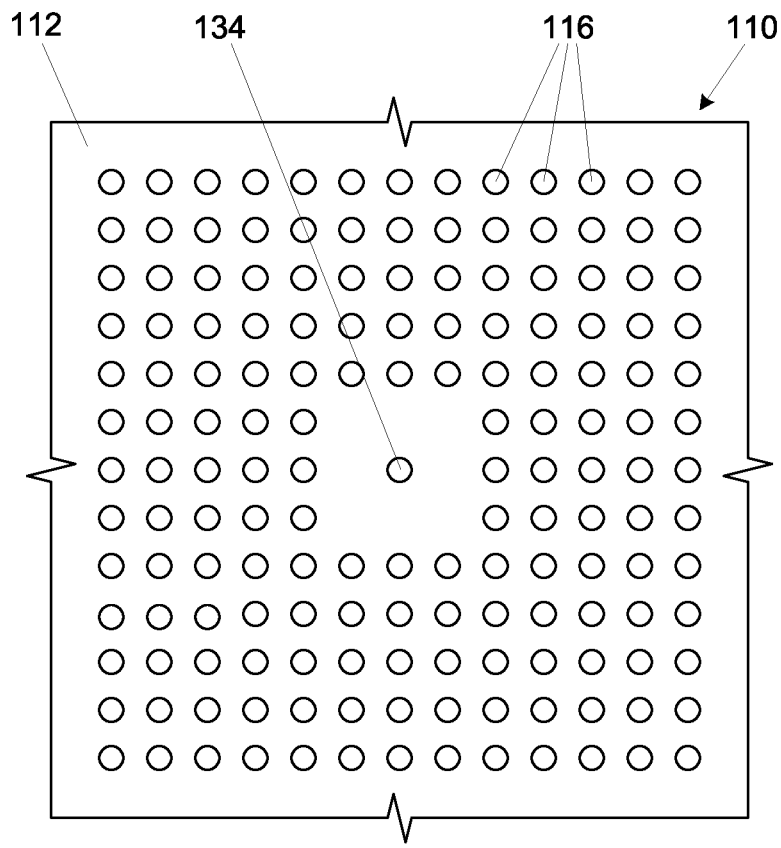
FIG. 2 is a view along line 2-2 of FIG. 1, according to an embodiment of the present description.

FIG. 2 illustrates a view along line 2-2 of FIG. 1. As shown, the opening 134 may be substantially centrally located within a substantially symmetrical array of bond pads 116 of the electronic substrate 110. However, it is understood that the opening 134 may be located in any position to achieve the shortest flow time of the underfill material 132, particularly when the bond pads 116 (and hence the device-to-substrate interconnects 130 (see FIG. 1)) have a non-symmetrical arrangement.

Figure 3:
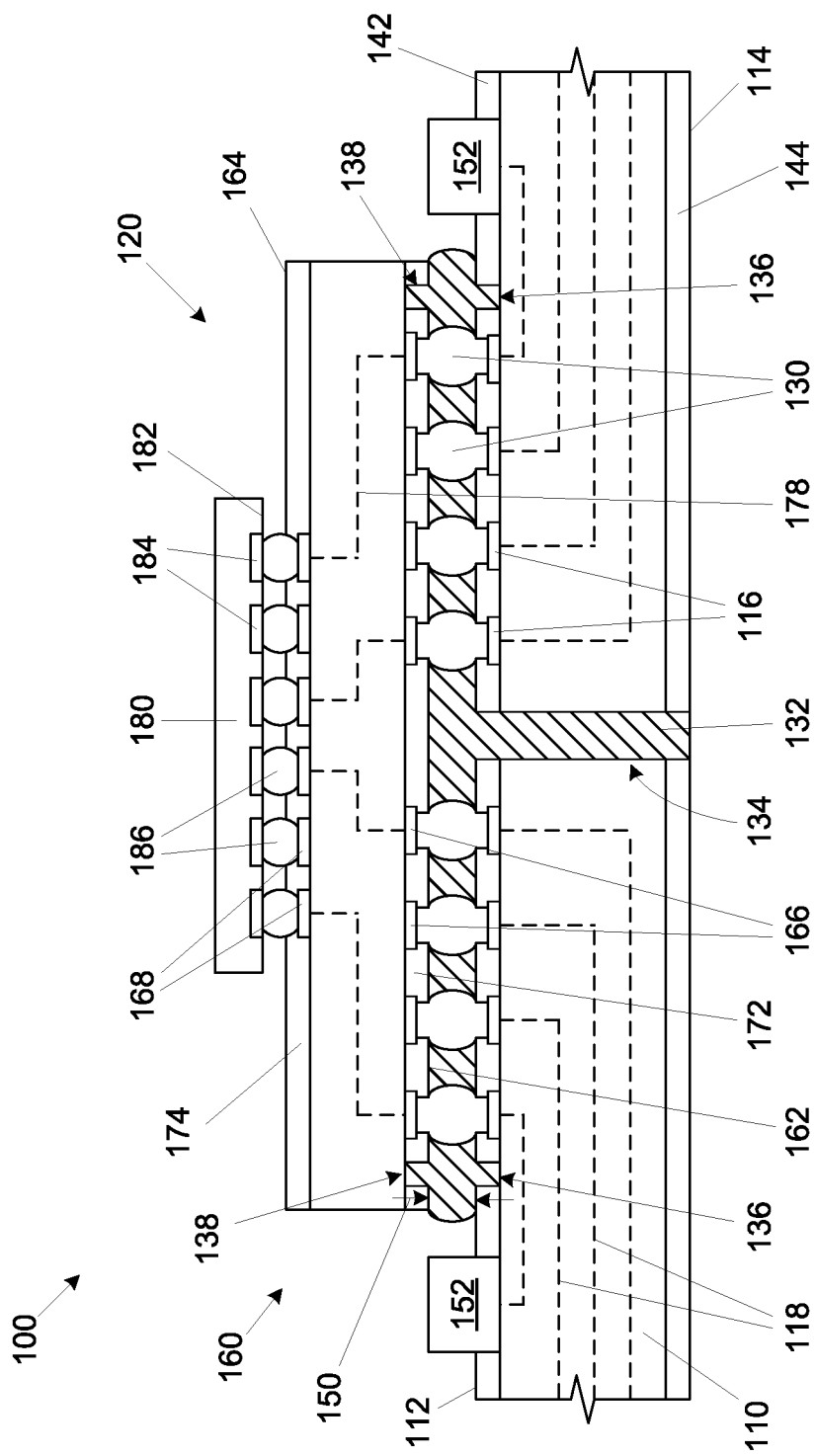
FIG. 3 is a side cross-sectional view of an integrated circuit assembly, according to another embodiment of the present description.

FIG. 3 illustrates a detailed embodiment of the present description. The integrated circuit device 120 may comprise an integrated circuit package having a package substrate 160 with a first surface 162 and an opposing second surface 164, and an integrated circuit die 180 electrically attached proximate the second surface 164 of the package substrate 160. In an embodiment of the present description, the package substrate 160 may be attached to the electronic substrate or board 110 with the plurality of device-to-substrate interconnects 130. In one embodiment of the present description, the device-to-substrate interconnects 130 may extend between bond pads 116 proximate the first surface 112 of the electronic substrate 110 and bond pads 166 proximate the first surface 162 of the package substrate 160.

The package substrate 160 may comprise any of the materials and/or structure as discussed previously with regard to the electronic substrate 110. The package substrate 160 may further include conductive routes 178 or "metallization" (shown in dashed lines) extending through the package substrate 160, which may comprise any of the materials and/or structures as discussed previously with regard to the conductive routes 118 of the electronic substrate 110. The bond pads 166 proximate the first surface 162 of the package substrate 160 may be in electrical contact with the conductive routes 178, and the conductive routes 178 may extend through the package substrate 160 and be electrically connected to bond pads 168 proximate the second surface 164 of the package substrate 160. As will be understood to those skilled in the art, the package substrate 160 may be a cored substrate or a coreless substrate.

In an embodiment of the present description, the integrated circuit die 180 may be electrically attached to the package substrate 160 with the plurality of die-to-substrate interconnects 186. In one embodiment of the present description, the die-to-substrate interconnects 186 may extend between bond pads 184 proximate a first surface 182 of the integrated circuit die 180 and bond pads 168 proximate the second surface 164 of the package substrate 160. The bond pads 184 of the integrated circuit die 180 may be in electrical communication with integrated circuitry (not shown) within the integrated circuit die 180.

In another embodiment of the present description, at least one power support device 152, such as an edge capacitor, may be electrically attached to the electronic substrate 110. As the embodiments of the present description may result in the reduction/elimination of the underfill material 132 bleeding-out from between the integrated circuit device 120 and the electronic substrate 110, the power support devices 152 to be placed closer to the integrated circuit device 120 than otherwise would have been allowed.

As further shown in FIG. 3, the electronic substrate 110 may include a first solder resist layer 142 proximate the first surface 112 of the electronic substrate 110 and a second solder resist layer 144 proximate the second surface 114 of the electronic substrate 110. A trench 136 may be formed in the first solder resist layer 142 of the integrated circuit device 120 in any appropriate position to assist in the containment of the underfill material 132 between the integrated circuit device 120 and the electronic substrate 110. In one embodiment, the trench 136 may be positioned proximate a gap 150 between the integrated circuit device 120 and electronic substrate 110. Additionally, the integrated circuit device 120 may include at least one solder resist layer, shown as a first solder resist layer 172 proximate the first surface 162 of the package substrate 160 and a second solder resist layer 174 proximate the second surface 164 of the package substrate 160. A trench 138 may be formed in the first solder resist layer 172 of the integrated circuit device 120 in any appropriate position to assist in the containment of the underfill material 132 between the integrated circuit device 120 and the electronic substrate 110. In one embodiment, the trench 138 may be positioned proximate the gap 150 between the integrated circuit device 120 and electronic substrate 110.

Figure 4:
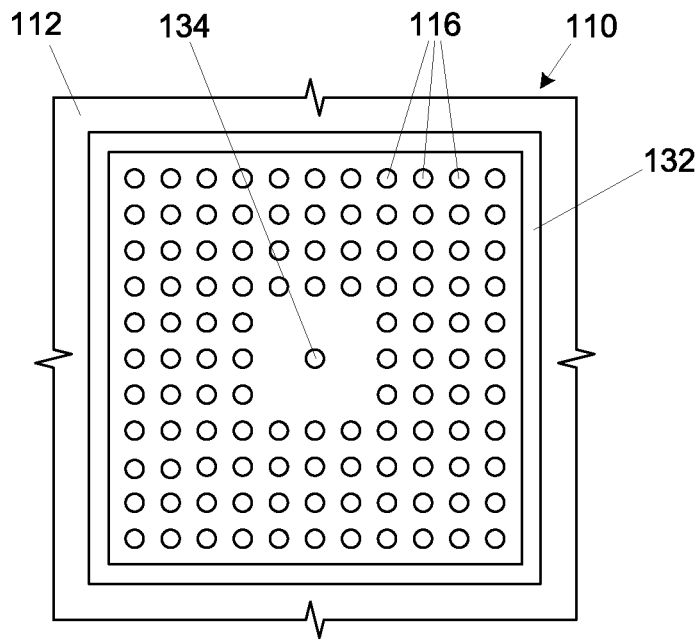
FIGS. 4 and 5 are views of the first surface of an electronic substrate of the integrated circuit assembly of FIG. 3, according to embodiments of the present description.
Figure 5:
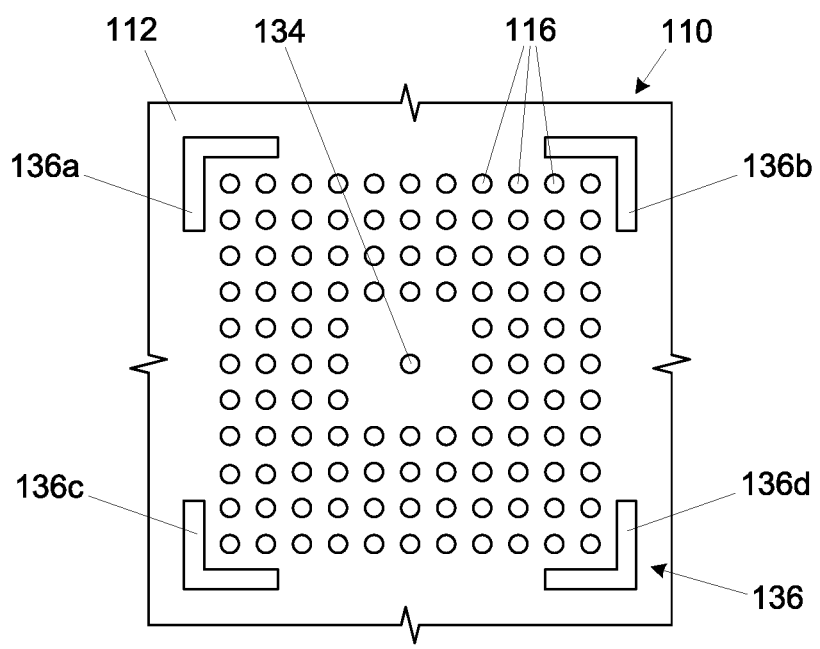

In one embodiment of the present invention shown in FIG. 4, the trench 136 of the electronic substrate 110 (shown) and/or the trench 138 of the integrated circuit device 120 may completely surround the device-to-substrate interconnects 130 (see FIG. 3), e.g. surround the bond pads 116 of the electronic substrate 110, as shown. In another embodiment of the present invention shown in FIG. 5, the trench 136 of the electronic substrate 110 (shown) and/or the trench 138 of the integrated circuit device 120 may be segmented (shown as segments 136a, 136b, 136c, and 136d) and/or positioned in areas of highest concern of underfill material 132 (see FIG. 3) bleed-out, as will be understood to those skilled in the art. Referring back to FIG. 3, the trench 136 of the electronic substrate 110 and the trench 138 of the integrated circuit device 120 may be substantially a mirror-image of one another.

Figure 6:
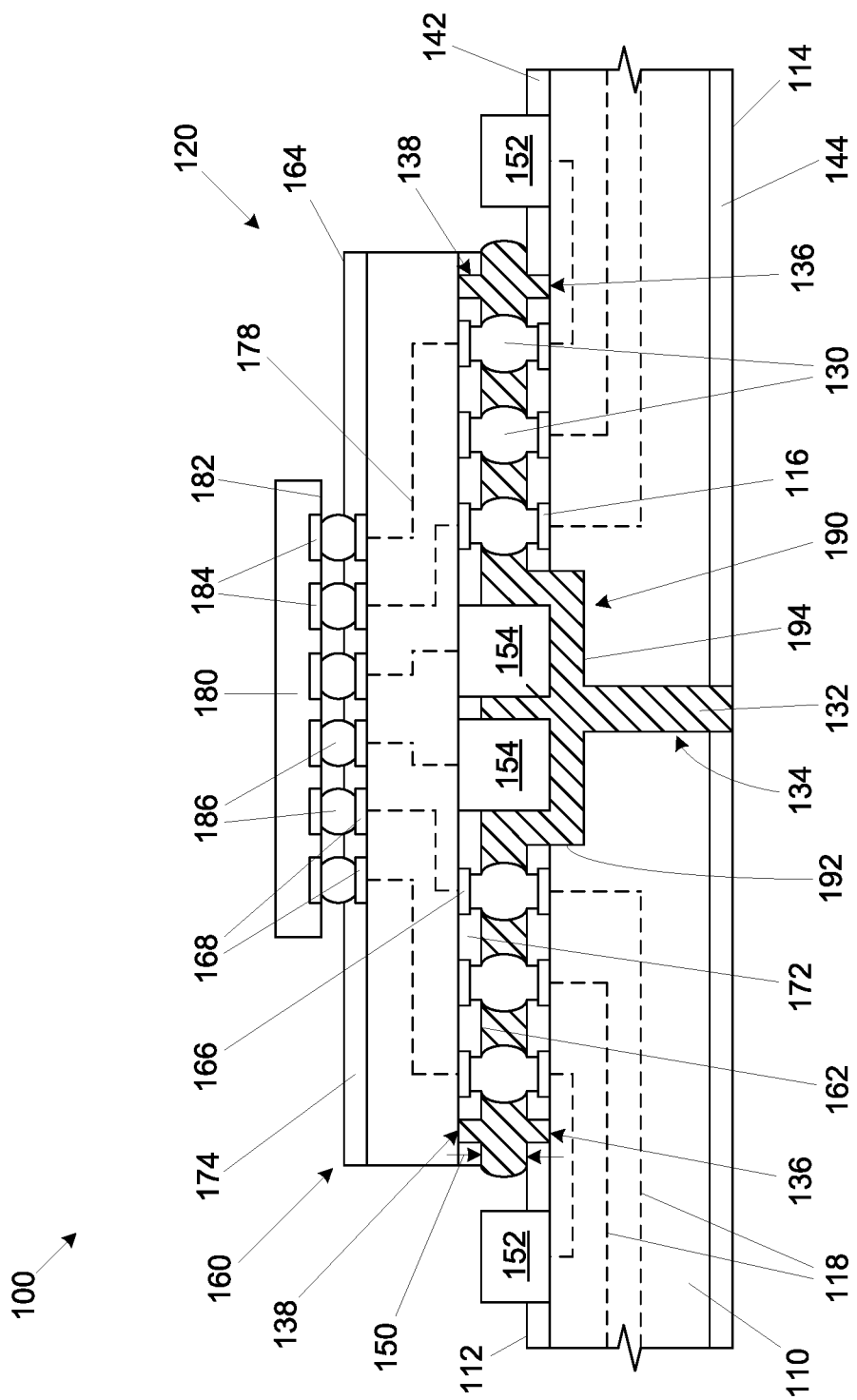
FIG. 6 is a side cross-sectional view of an integrated circuit assembly, according to still another embodiment of the present description.

As shown in FIG. 6, in order to reduce the size of the overall platform and improve power deliver through a shorter power delivery path (reduced inductance loop), at least one capacitor 154 may be electrically attached to the package substrate 160 at a first surface thereof. This may necessitate the formation of a recess 190 extending into the electronic substrate 110 to accommodate the space taken by the capacitors 154. The recess 190 may be defined by at least one recess sidewall 192 extending into the electronic substrate 110 and terminating at a recess bottom surface 194. Thus, in this embodiment, the first surface 112 of the electronic substrate 110 will include the at least one recess sidewall 192 and the recess bottom surface 194. As further shown in FIG. 6, the opening 134 may extend from the second surface 114 of the electronic substrate 110 to the recess bottom surface 194 of the first surface 112 for the electronic substrate 110. In this embodiment, a portion of the underfill material 132 will reside within the recess 190.

As will be understood to those skilled in the art, the embodiments of the present description may have distinct advantages over known integrated circuit assemblies. One advantage may be a reduction in the size of the integrated circuit device 120 through the reduction or elimination of the need for die shadow non-critical to function (NCTF) balls due to improved solder joint reliability. A further advantage may be a reduction in the overall platform size through the reduction in the size of the integrated circuit device 120 and the reduction/elimination of the underfill material 132 bleeding-out from between the integrated circuit device 120 and the electronic substrate 110. Furthermore, reduction/elimination of the underfill material 132 bleeding-out from between the integrated circuit device 120 and the electronic substrate 110 may allow for the power support devices 152 to be placed closer to the integrated circuit device 120, which may further reduce the size of the overall platform and may improve power deliver through a shorter power delivery path (reduced inductance loop).

As will be understood to those skilled in the art, the embodiments of the present description may also have distinct advantages over known underfill materials and processes. By eliminating capillary action as the main driver for delivering the underfill material 132 and replacing it with a positive-pressure, "injection-like" process of the embodiments of the present description, the throughput time for underfilling may be reduced. Furthermore, alternative underfill materials 132 and processes may be used. For example, underfill materials having higher fill material volume, which have higher viscosities, may be able to be utilized. These underfill materials may have coefficients of thermal expansion which more closely match the coefficients of thermal expansion of the integrated circuit device 120 and/or the electronic substrate 110, which may improve the reliability of the interconnects 130. Additionally, underfill materials having high thermal conductivity, such as an epoxy resin having an aluminum nitride filler, may allow for better thermal conductivity toward/through the electronic substrate 110, which can reduce the thermal load on the heat dissipation solutions that are attached to the integrated circuit device 120.

Figure 7:
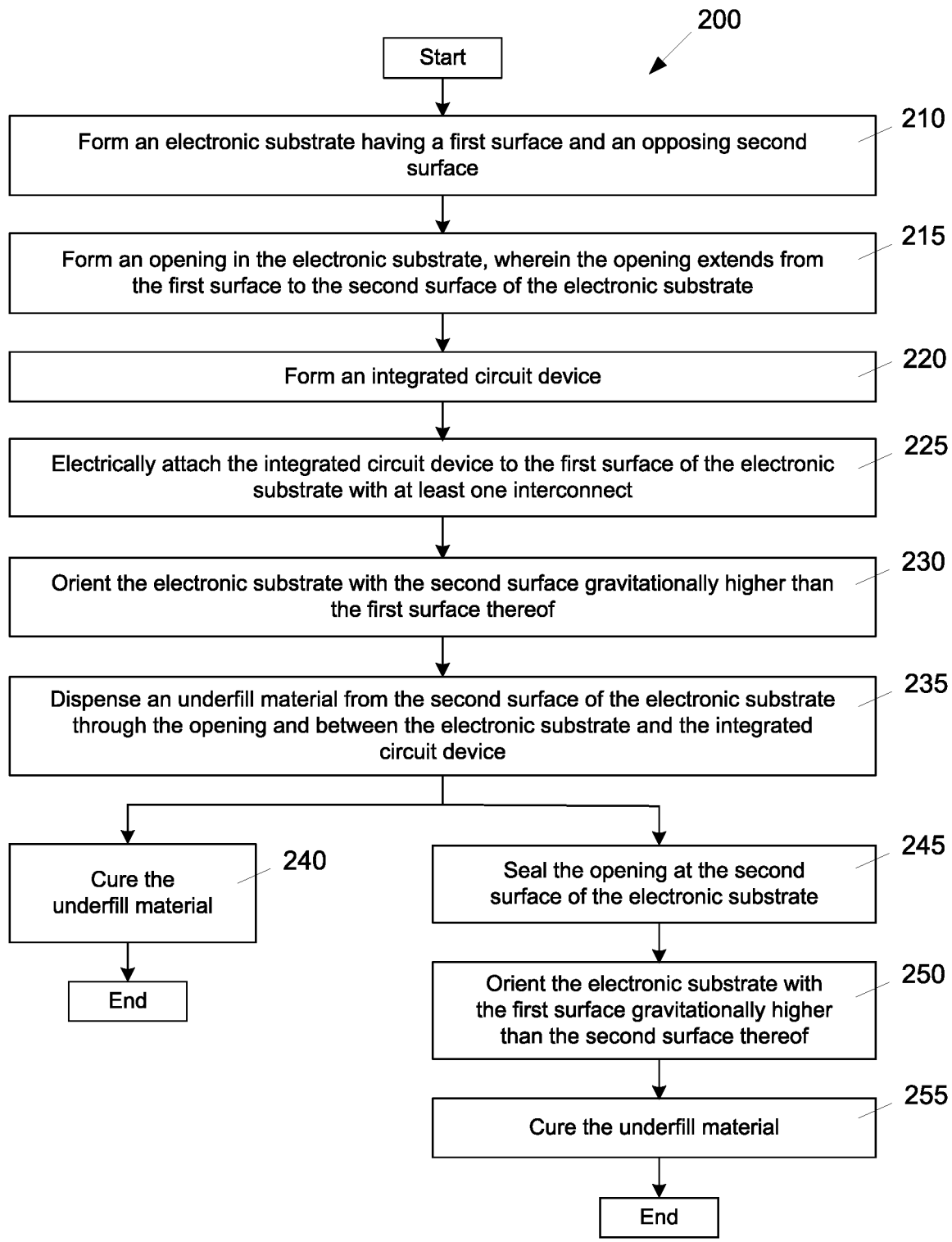
FIG. 7 is a flow chart of a process of fabricating an integrated circuit assembly, according to an embodiment of the present description.

FIG. 7 is a flow chart of a process 200 of fabricating an integrated circuit assembly. As set forth in block 210, an electronic substrate having a first surface and an opposing second surface may be formed. An opening may be forming in the electronic substrate, wherein the opening extends from the first surface to the second surface of the electronic substrate, as set forth in block 215. As set forth in block 220, an integrated circuit device may be formed. As set forth in block 225, the integrated circuit device may be electrically attached to the first surface of the electronic substrate. The electronic substrate may be oriented with the second surface gravitationally higher than the first surface thereof, as set forth in block 230. As set for in block 235, an underfill material may be dispensed from the second surface of the electronic substrate through the opening and between the electronic substrate and the integrated circuit device. The underfill material may be cured, as set forth in block 240. Alternately, from block 235, the opening may be sealed, such as with shielding or grounding tape, at the second surface of the electronic substrate, as set forth in 245. As set forth in block 250, the electronic substrate may be oriented with the first surface gravitationally higher than the second surface thereof. The underfill material may be cured, as set forth in block 255. Sealing the opening may allow for a delay in curing the underfill material until later in the packaging process, as will be understood to those skilled in the art.

Figure 8:
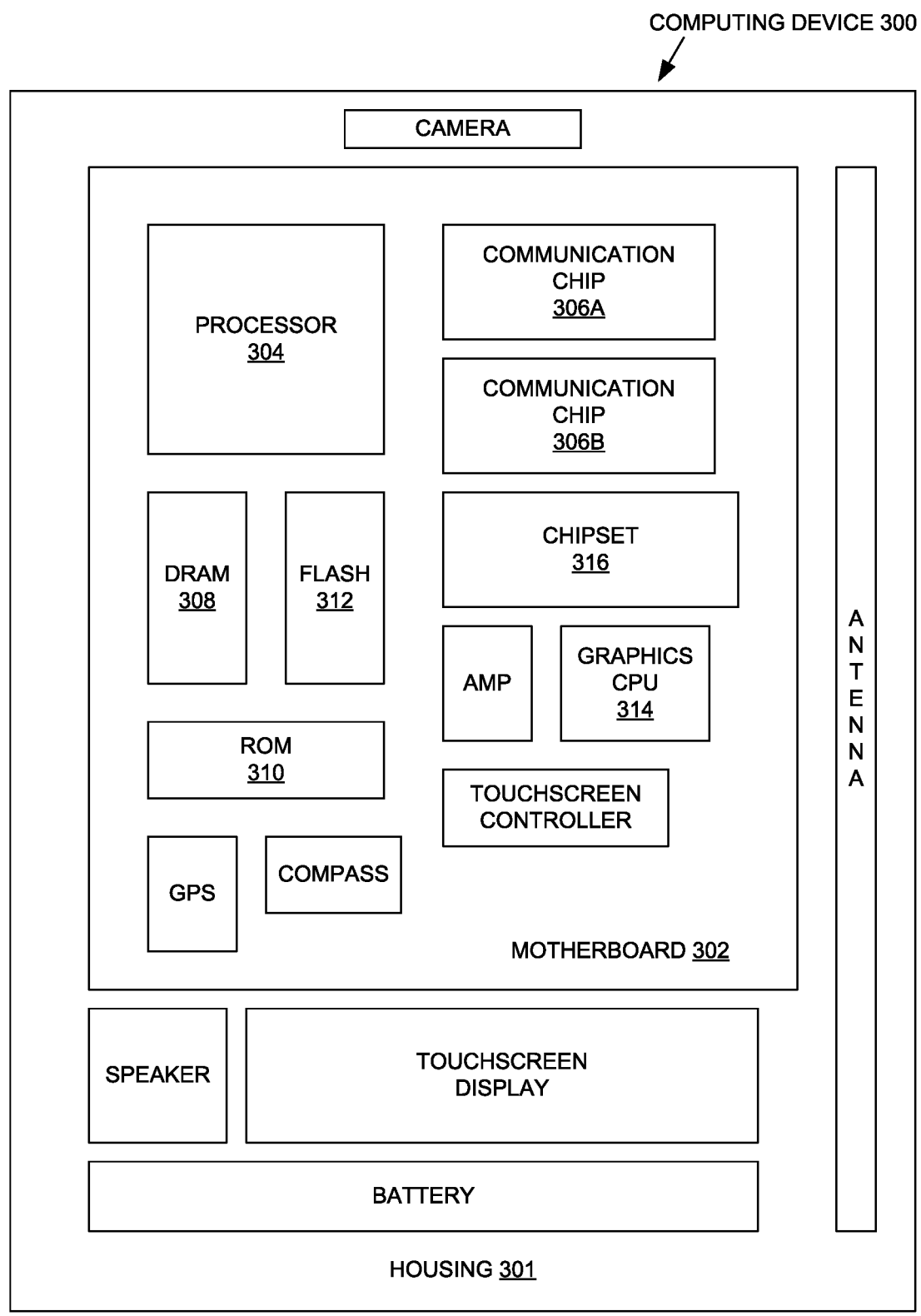
FIG. 8 is an electronic system, according to one embodiment of the present description.

FIG. 8 illustrates an electronic or computing device 300 in accordance with one implementation of the present description. The computing device 300 may include a housing 301 having a board 302 disposed therein. The computing device 300 may include a number of integrated circuit components, including but not limited to a processor 304, at least one communication chip 306A, 306B, volatile memory 308 (e.g., DRAM), non-volatile memory 310 (e.g., ROM), flash memory 312, a graphics processor or CPU 314, a digital signal processor (not shown), a crypto processor (not shown), a chipset 316, an antenna, a display (touchscreen display), a touchscreen controller, a battery, an audio codec (not shown), a video codec (not shown), a power amplifier (AMP), a global positioning system (GPS) device, a compass, an accelerometer (not shown), a gyroscope (not shown), a speaker, a camera, and a mass storage device (not shown) (such as hard disk drive, compact disk (CD), digital versatile disk (DVD), and so forth). Any of the integrated circuit components may be physically and electrically coupled to the board 302. In some implementations, at least one of the integrated circuit components may be a part of the processor 304.

The communication chip enables wireless communications for the transfer of data to and from the computing device. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device may include a plurality of communication chips. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others.

The term "processor" may refer to any device or portion of a device that processes electronic data from registers and/or memory to transform that electronic data into other electronic data that may be stored in registers and/or memory.

In one embodiment, at least one of the integrated circuit components may include an electronic substrate having a first surface and an opposing second surface, wherein the electronic substrate includes at least one opening extending from the first surface to the second surface; an integrated circuit device, wherein the integrated circuit device is electrically attached to the electronic substrate with at least one interconnect; and an underfill material between the first surface of the electronic substrate and the integrated circuit device, wherein a portion of the underfill material extends into the opening in the electronic substrate. In another embodiment, the electronic board 302 may have a first surface and an opposing second surface, wherein the electronic board 302 includes at least one opening extending from the first surface to the second surface. An integrated circuit package may be electrically attached to the electronic board 302 and an underfill material may be formed between the integrated circuit package and the electronic board 302, wherein a portion of the underfill material extends into the opening in the electronic board 302.

In various implementations, the computing device may be a laptop, a netbook, a notebook, an ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the computing device may be any other electronic device that processes data.

It is understood that the subject matter of the present description is not necessarily limited to specific applications illustrated in FIGS. 1-8. The subject matter may be applied to other integrated circuit devices and assembly applications, as well as any appropriate electronic application, as will be understood to those skilled in the art.

The following examples pertain to further embodiments and specifics in the examples may be used anywhere in one or more embodiments, wherein Example 1 is an integrated circuit assembly comprising an electronic substrate having a first surface and an opposing second surface wherein the electronic substrate includes at least one opening extending from the first surface to the second surface, an integrated circuit device, wherein the integrated circuit device is electrically attached to the electronic substrate with at least one interconnect, and an underfill material between the first surface of the electronic substrate and the integrated circuit device, wherein a portion of the underfill material extends into the opening in the electronic substrate.

In Example 2, the subject matter of Example 1 can optionally include at least one of the integrated circuit device and the electronic sub state including a trench formed therein, wherein the trench is position proximate a gap between the integrated circuit and the electronic substrate.

In Example 3, the subject matter of Example 2 can optionally include a portion of the underfill material resides with the trench.

In Example 4, the subject matter of any of Examples 1 to 3 can optionally include the underfill material substantially surrounds the at least one interconnect.

In Example 5, the subject matter of aby of Examples 1 to 4 can optionally include the integrated circuit device comprises an integrated circuit die.

Example 6 is an electronic system, comprising an electronic board having a first surface and an opposing second surface, wherein the electronic substrate includes at least one opening extending from the first surface to the second surface; an integrated circuit package electrically attached to the electronic board, wherein the integrated circuit package comprises an package substrate having a first surface and an opposing second surface, at lease integrated circuit die, wherein the at least one integrated circuit die is electrically attached to the package substrate with at least one interconnect; and an underfill material between the first surface of the package substrate and the first surface of the electronic board, wherein a portion of the underfill material extends into the opening in the electronic board.

In Example 7, the subject matter of Example 6 can optionally include a recess extending into the electronic board from the first surface thereof.

In Example 8, the subject matter of Example 7 can optionally include the recess being defined by at least one recess sidewall that terminates at a recess bottom surface, such that first surface of the electronic board includes the at least one recess sidewall and recess bottom surface, and wherein the opening extends from recess bottom surface to the second surface of the electronic board.

In Example 9, the subject matter of any of Examples 7 to 8 can optionally include at least one capacitor electrically attached to the first surface of the package substrate, wherein the at least one capacitor extends into the at least one recess.

In Example 10, the subject matter of any of Examples 6 to 9 can optionally include at least one of the package substrate and the electronic substrate includes a trench formed therein, wherein the trench is positioned proximate a gap between the integrated circuit and the electronic substrate.

In Example 11, the subject matter of Example 10 can optionally include a portion of the underfill material resides within the trench.

In Example 4, the subject matter of any of Examples 1 to 3 can optionally include the underfill material substantially surrounds the at least one interconnect.

Example 13 is a method of fabricating an integrated circuit assembly comprising forming an electronic substrate having a first surface and an opposing second surface, forming an opening in the electronic substrate, forming an integrated circuit device, electrically attaching the integrated circuit device to the electronic substrate with at least one interconnect; orienting the electronic substrate with the second surface gravitationally higher than the first surface thereof; dispensing an underfill material from the second surface of the electronic substrate through the opening and between the electronic substrate and the integrated circuit device; and cure the underfill material.

In Example 14, the subject matter of Example 13 can optionally include sealing the opening at the second surface of the electronic substrate after dispensing the underfill material, and orienting the electronic substrate with the first surface gravitationally higher than the second surface thereof prior to curing the underfill material.

In Example 15, the subject matter of any of Examples 13 and 14 can optionally include forming a recess extending into the electronic board from the first surface thereof.

In Example 16, the subject matter of Example 15 can optionally include the recess being defined by at least one recess sidewall that terminates at a recess bottom surface, such that first surface of the electronic board includes the at least one recess sidewall and recess bottom surface, and wherein the opening extends from recess bottom surface to the second surface of the electronic board.

In Example 17, the subject matter of any of Examples 15 to 16 can optionally include electrically attaching at least one capacitor to the first surface of the package substrate, wherein the at least one capacitor extends into the at least one recess.

In Example 18, the subject matter of any of Examples 6 to 9 can optionally include at least one of the package substrate and the electronic substrate includes a trench formed therein, wherein the trench is positioned proximate a gap between the integrated circuit and the electronic substrate.

In Example 19, the subject matter of Example 18 can optionally include a portion of the underfill material resides within the trench.

In Example 20, the subject matter of any of Examples 13 to 19 can optionally include the underfill material substantially surrounds the at least one interconnect.

Having thus described in detail embodiments of the present invention, it is understood that the invention defined by the appended claims is not to be limited by particular details set forth in the above description, as many apparent variations thereof are possible without departing from the spirit or scope thereof.

What is claimed is:

1. An electronic system, comprising:
   an electronic board having a first surface and an opposing second surface, wherein the electronic board includes at least one opening extending from the first surface to the opposing second surface;
   an integrated circuit package spanning the opening and electrically attached to the electronic board with a plurality of first interconnects laterally adjacent to the opening, wherein the integrated circuit package, comprises:
   a package substrate having a first surface and an opposing second surface;
   at least one integrated circuit die, wherein the at least one integrated circuit die is electrically attached to the package substrate with a plurality of second interconnects; and
   a single body of underfill material between the first surface of the package substrate and the first surface of the electronic board, wherein a portion of the single body of underfill material extends into the opening in the electronic board and another portion of the single body of underfill material substantially surrounds individual ones of the first interconnects, wherein the electronic board has a recess extending therein from the first surface thereof, the recess extending between the opening and the plurality of first interconnects and filled with another portion of the single body of underfill.

2. The electronic system of claim 1, wherein the recess comprises at least one recess sidewall that terminates at a recess bottom surface and wherein the recess sidewall encircles the opening and the plurality of first interconnects encircle the recess.

3. The electronic system of claim 1, further comprising at least one capacitor electrically attached to the first surface of the package substrate, wherein the at least one capacitor extends into the recess and is in contact with the single body of underfill material.

4. The electronic system of claim 1, wherein at least one of the package substrate and the electronic board includes a trench therein, wherein the trench is on a side of the plurality of first interconnects opposite the opening.

5. The electronic system of claim 4, wherein another portion of the single body of underfill material resides within the trench.

6. The electronic system of claim 4, wherein the plurality of first interconnects encircle the opening and the trench encircles the plurality of first interconnects.

7. The electronic system of claim 4, wherein the package substrate includes a first trench therein, and the electronic board includes a second trench therein, wherein the first trench and the second trench are both laterally spaced apart from the opening with the plurality of first interconnects in a space between the opening and both of the first and second trenches.

8. The electronic system of claim 4, wherein the trench is one of four trenches proximal to corners of an array of the first interconnects.

9. The electronic system of claim 1, wherein the opening is proximal to a center of a footprint of the package substrate, and wherein the plurality of first interconnects comprises a row of solder features encircling the opening.

10. The electronic system of claim 9, wherein the plurality of first interconnects comprises two rows of solder features, a first of the rows encircling the opening and a second of the rows encircling the first of the rows.

* * * * *